US009153633B2

(12) United States Patent
You

(10) Patent No.: US 9,153,633 B2
(45) Date of Patent: Oct. 6, 2015

(54) ORGANIC LIGHT-EMITTING DISPLAY APPARATUS AND MANUFACTURING METHOD THEREOF

(71) Applicant: SAMSUNG DISPLAY CO., LTD., Yongin, Gyeonggi-Do (KR)

(72) Inventor: Chun-Gi You, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/276,187

(22) Filed: May 13, 2014

(65) Prior Publication Data

US 2015/0069343 A1    Mar. 12, 2015

(30) Foreign Application Priority Data

Sep. 9, 2013    (KR) .......................... 10-2013-0108062

(51) Int. Cl.
*H01L 27/32* (2006.01)
*H01L 51/52* (2006.01)
*H01L 51/56* (2006.01)

(52) U.S. Cl.
CPC ........ *H01L 27/3248* (2013.01); *H01L 27/3258* (2013.01); *H01L 51/5212* (2013.01); *H01L 51/56* (2013.01)

(58) Field of Classification Search
CPC .................................................. H01L 27/3248
See application file for complete search history.

(56) References Cited

U.S. PATENT DOCUMENTS

| 8,395,160 | B2 | 3/2013 | Park et al. |
| 2009/0201230 | A1 | 8/2009 | Smith |
| 2010/0090209 | A1 | 4/2010 | Ikari et al. |
| 2012/0074413 | A1* | 3/2012 | Kim ................................ 257/59 |
| 2012/0286281 | A1* | 11/2012 | You ................................ 257/72 |
| 2013/0015456 | A1* | 1/2013 | You ................................ 257/71 |
| 2013/0126882 | A1 | 5/2013 | You et al. |
| 2013/0228786 | A1* | 9/2013 | Park ............................... 257/72 |
| 2014/0353622 | A1* | 12/2014 | You et al. .......................... 257/40 |

FOREIGN PATENT DOCUMENTS

| KR | 10-2003-0054795 A | 7/2003 |
| KR | 10-2010-0040679 A | 4/2010 |
| KR | 10-2011-0058076 A | 6/2011 |
| KR | 10-2013-0055446 A | 5/2013 |

* cited by examiner

*Primary Examiner* — Daniel Luke
(74) *Attorney, Agent, or Firm* — Lee & Morse, P.C.

(57) ABSTRACT

An organic light-emitting display apparatus includes a thin film transistor (TFT) including an active layer, a gate electrode, source and drain electrodes, a first insulating layer between the active layer and the gate electrode, and a second insulating layer between the gate electrode and the source and drain electrodes, a capacitor including a first electrode on a same layer as the active layer and a second electrode on a same layer as the gate electrode, a first contact layer of a same material as the second electrode, a second contact layer on the first contact layer, the second contact layer being of a same material as the gate electrode, a pixel electrode that contacts an edge of the first contact layer and is on an opening in the second insulating layer, an organic emission layer on the pixel electrode, and a counter electrode on the organic emission layer.

20 Claims, 6 Drawing Sheets

ORGANIC LIGHT-EMITTING DISPLAY APPARATUS AND MANUFACTURING METHOD THEREOF

CROSS-REFERENCE TO RELATED APPLICATION

Korean Patent Application No. 10-2013-0108062, filed on Sep. 9, 2013, in the Korean Intellectual Property Office, and entitled: "Organic Light-Emitting Display Apparatus and Manufacturing Method Thereof," is incorporated by reference herein in its entirety.

BACKGROUND

1. Field

One or more embodiments relate to an organic light-emitting display apparatus and a method of manufacturing the same.

2. Description of the Related Art

An organic light-emitting display apparatus is a self-emitting type display apparatus that includes a hole injection electrode, electron injection electrode, and an organic emission layer formed between the hole and electron injection electrodes, wherein light is emitted by holes injected from the hole injection electrode and electrons injected from the electron injection electrode reuniting and dissipating in the organic emission layer. With characteristics such as low power consumption, high brightness, and high response rates, the organic light-emitting display apparatus has drawn attention as a next generation display apparatus.

SUMMARY

Embodiments are directed to an organic light-emitting display apparatus, including a thin film transistor (TFT) including an active layer, a gate electrode, a source electrode and a drain electrode, a first insulating layer between the active layer and the gate electrode, and a second insulating layer between the gate electrode and the source electrode and the drain electrode, a capacitor including a first electrode on a same layer as the active layer and a second electrode on a same layer as the gate electrode, a first contact layer of a same material as the second electrode, a second contact layer on the first contact layer, the second contact layer being of a same material as the gate electrode, a pixel electrode that contacts an edge of the first contact layer and is on an opening in the second insulating layer, an organic emission layer on the pixel electrode and a counter electrode on the organic emission layer.

The pixel electrode may include a semi-transmittance metal layer.

The semi-transmittance metal layer may include silver (Ag) or an Ag alloy.

The counter electrode may include a reflective metal layer.

The first contact layer and the second contact layer may be between the first insulating layer and the second insulating layer.

The first contact layer may include a transparent conductive oxide.

The edge of the first contact layer may protrude over an edge of the second contact layer.

One of the source electrode and the drain electrode may contact the second contact layer via a contact hole formed in the second insulating layer.

The source electrode and the drain electrode may be in a form of a stack of metal layers that have different electron mobilities.

The source electrode and the drain electrode may include a layer including molybdenum (Mo) and a layer including aluminum (Al).

The first electrode of the capacitor may include a semiconductor material doped with ion impurities.

The second electrode of the capacitor may include a transparent conductive oxide.

The capacitor may further include a third electrode on a same layer as the source electrode and the drain electrode.

The apparatus may further include a third insulating layer that covers an edge of the pixel electrode and the source electrode and the drain electrode.

The third insulating layer may be an organic insulating layer.

Embodiments are also directed to a method of manufacturing an organic light-emitting display apparatus including forming an active layer of a thin film transistor (TFT) and a first electrode of a capacitor, by forming a semiconductor layer on a substrate and patterning the semiconductor layer, forming a second electrode of the capacitor and a first contact layer, by forming a first insulating layer, forming a transparent conductive oxide on the first insulating layer, and patterning the transparent conductive oxide, forming a gate electrode of the TFT on a same layer as the second electrode and forming a second contact layer on the first contact layer, by forming a first metal layer and patterning the first metal layer, forming a second insulating layer and forming in the second insulating layer a contact hole to expose a portion of the active layer and an opening to expose the second contact layer, forming a source electrode and a drain electrode of the TFT by forming a second metal layer and patterning the second metal layer, and patterning the second contact layer to expose an edge of the first contact layer, forming a pixel electrode that contacts the edge of the first contact layer, by forming a semi-transmittance metal layer and patterning the semi-transmittance metal layer, forming an opening to expose an upper surface of the pixel electrode, by forming a third insulating layer and patterning the third insulating layer, forming an organic emission layer on the pixel electrode, and forming a counter electrode on the organic emission layer.

Patterning the semi-transmittance metal layer may include leaving a photoresist in a region in which the pixel electrode is formed. Patterning the third insulating layer may include removing the photoresist.

The photoresist and the third insulating layer may be formed of a same material as an organic insulating layer.

The method may further include doping the active layer and the first electrode of the capacitor with ion impurities once, after the forming of the gate electrode.

The second metal layer may be a stack of metal layers that have different electron mobilities.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
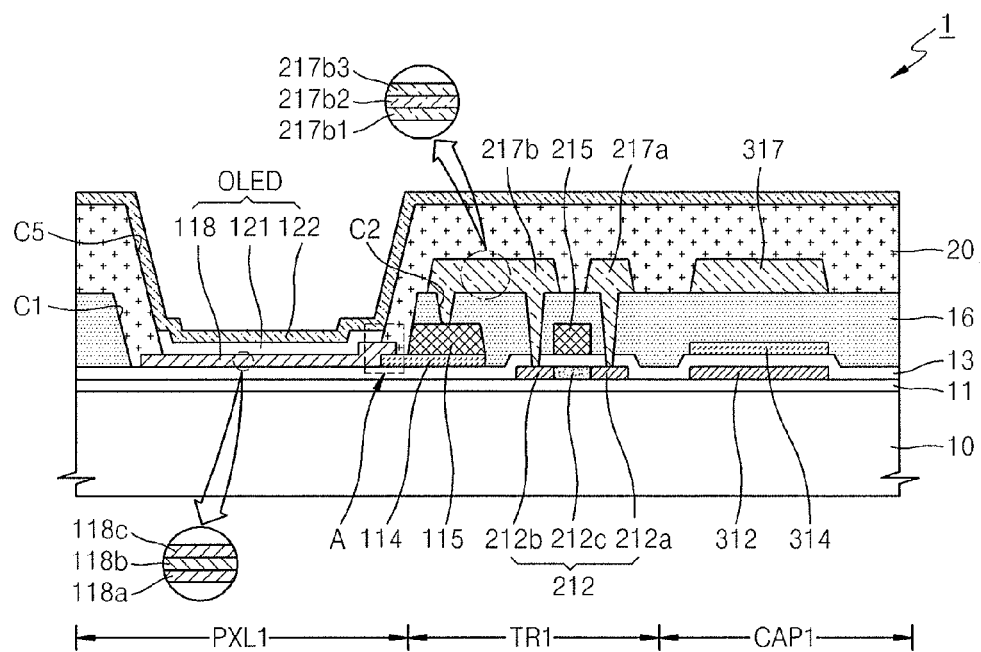
FIG. 1 illustrates a cross-sectional view depicting an organic light-emitting display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the term "and/or" includes any and all combinations of one or more of the associated listed items. Expressions such as "at least one of," when preceding a list of elements, modify the entire list of elements and do not modify the individual elements of the list.

It is to be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

FIG. 1 illustrates a cross-sectional view depicting an organic light-emitting display apparatus 1 according to an embodiment.

Referring to FIG. 1, the organic light-emitting display apparatus 1 according to an embodiment includes a pixel region PXL1 including at least one organic emission layer 121, a transistor region TR1 including at least one thin film transistor (TFT), and a capacitor region CAP1 including at least one capacitor, on a substrate 10.

In the transistor region TR1, a buffer layer 11 may be arranged on the substrate 10, and, the TFT may be included on the buffer layer 11.

The substrate 10 may be a glass substrate or may be a plastic substrate including polyethylene terephthalate (PET), polyethylene naphthalate (PEN), or polyimide, as examples.

The buffer layer 11 may further be included on an upper portion of the substrate 10 to form a flat surface and prevent penetration of impure elements. The buffer layer 11 may be formed as a single layer or multiple layers, including silicon nitride and/or silicon oxide.

The TFT may include an active layer 212, a gate electrode 215, and a source electrode 217a and a drain electrode 217b.

The active layer 212 may include a channel region 212c, and a source region 212a and a drain region 212b that are doped with ion impurities on the outer side of the channel region 212c. The active layer 212 may be formed to include various materials. For example, the active layer 212 may include an inorganic semiconductor material, such as amorphous silicon or polysilicon. In other implementations, the active layer 212 may include an oxide semiconductor. In other implementations, the active layer 212 may include an organic semiconductor material.

A first insulating layer 13, which may be a gate insulating layer, may be formed on the active layer 212. The gate electrode 215 may be included on the first insulating layer 13 in a position corresponding to the channel region 212c.

The gate electrode 215 may be formed as a single layer or as multiple layers of at least one metal selected from the group of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

A second insulating layer 16, which may be an interlayer insulating layer, may be formed on the gate electrode 215. The source electrode 217a and the drain electrode 217b may be included on the second insulating layer 16.

The source electrode 217a and the drain electrode 217b may contact the source region 212a and the drain region 212b of the active layer 212, respectively, through an opening formed in the second insulating layer 16. The source electrode 217a and the drain electrode 217b may be a stack of two or more metal layers that have different electron mobilities. For example, the source electrode 217a and the drain electrode 217b may be a stack of two or more layers of at least one metal layer selected from the group of Al, Pt, Pd, Ag, Mg, Au, Ni, Nd, Ir, Cr, Li, Ca, Mo, Ti, W, and Cu.

Wirings, including data wirings and electrode power supply wirings, may be formed on the same layer as, and of the same material as, the source electrode 217a and the drain electrode 217b.

The first insulating layer 13 and the second insulating layer 16 may be inorganic insulating layers. The first insulating layer 13 and the second insulating layer 16 may be formed as a single layer or as multiple layers of at least one insulating layer selected from the group of $SiO_2$, $SiN_x$, $SiON$, $Al_2O_3$, $TiO_2$, $Ta_2O_5$, $HfO_2$, $ZrO_2$, BST, and PZT.

A third insulating layer 20 may be formed on the second insulating layer 16 to cover the source electrode 217a and the drain electrode 217b.

The third insulating layer 20 may be formed as a single or multiple organic insulating layers. The third insulating layer 20 may include a polymer, such as polymethylmethacrylate (PMMA) and polystyrene (PS), a polymer derivative having a phenol group, an acryl-based polymer, an imide-based polymer, an aryl ether-based polymer, an amide-based polymer, a fluorine-based polymer, a p-xylene-based polymer, a vinyl alcohol-based polymer, or any mixtures thereof. According to the present embodiment, the third insulating layer 20 may be formed of polyimide, which allows little out-gassing.

An organic light-emitting device (OLED) may be formed in the pixel region PXL1. The OLED may include a pixel electrode 118, a counter electrode 122 that is opposite to the pixel electrode 118, and the organic emission layer 121 that is between the pixel electrode 118 and the counter electrode 122.

The TFT illustrated in FIG. 1 is a driving TFT that drives the OLED. Although the TFT of FIG. 1 illustrates a driving TFT, the organic light-emitting display apparatus 1 according to the present embodiment may further include a switching TFT or a compensation TFT.

The structure of the TFT illustrated in FIG. 1 is an example that may be implemented in the organic light-emitting display apparatus 1 according to an embodiment. In other implementations, other structures may be used.

According to the present embodiment, the pixel electrode 118 may include a semi-transmittance material. The pixel electrode 118 may include a semi-transmittance metal layer 118b. Transparent conductive oxide layers 118a and 118c including transparent conductive oxides may further be arranged respectively on an upper portion and a bottom portion of the semi-transmittance metal layer 118b.

The semi-transmittance metal layer 118b may be formed of silver (Ag) or an Ag alloy. The semi-transmittance metal layer 118b may form a micro-cavity structure along with the counter electrode 122, which is a reflection electrode (described below), such that a luminescent efficiency of the organic light-emitting display apparatus 1 may be improved. The transparent conductive oxide layers 118a and 118c including transparent conductive oxides may include at least one selected from the group of indium tin oxide (ITO), indium zinc oxide (IZO), zinc oxide (ZnO), indium oxide ($In_2O_3$), indium gallium oxide (IGO), and aluminum zinc oxide (AZO).

The transparent conductive oxide layer 118a arranged on the bottom portion of the semi-transmittance metal layer 118b may enhance adhesive strength between the pixel electrode 118 and the first insulating layer 13.

The transparent conductive oxide layer 118c arranged on the upper portion of the semi-transmittance metal layer 118b may serve as a barrier layer that protects the semi-transmittance metal layer 118b.

In the case of a metal which has strong reducing power, such as Ag, which is included in the semi-transmittance metal layer 118b, Ag, which remains as ions in an etchant, may again be extracted as Ag, when, during an etching process for patterning the pixel electrode 118, electrons are supplied. Ag extracted in such a way may be a particle fault factor leading to a generation of dark spots in a sequential process after forming the pixel electrode 118.

If, in the etching process of the pixel electrode 118 including Ag, the source electrode 217a and the drain electrode 217b, or wirings including data wirings and electrode power supply wirings, which are formed of the same material as the source electrode 217a and the drain electrode 217b, are exposed to an etchant, Ag ions that have strong reducing power may be re-extracted as Ag by being supplied electrons from the above metal materials. For example, if the metal materials include Mo or Al, Ag may be re-extracted because Mo provides electrons received from Al to Ag ions. Ag particles, which are re-extracted, may be re-attached to the pixel electrode 118 in a sequential process and may be a particle pollution factor. For example, the Ag particles may generate dark spots.

In the organic light-emitting display apparatus 1 according to the present embodiment, during the patterning of the pixel electrode 118, the pixel electrode 118 is protected by being covered by a photoresist 19R (refer to FIGS. 7A and 7B) that includes the same material as the third insulating layer 20 (described below). Thus, Ag particles, which are re-extracted while etching the pixel electrode 118, may be prevented from being re-attached to the pixel electrode 118, thereby preventing dark spots and increasing yield.

The pixel electrode 118 may be disposed on an opening C1 formed in the second insulating layer 16.

An edge of the pixel electrode 118 may be covered by the third insulating layer 20, and an upper surface of the pixel electrode 118 may be exposed in an opening C5 formed in the third insulating layer 20. The third insulating layer 20 may serve as a pixel-defining layer.

The opening C1 formed in the second insulating layer 16 may be formed larger than the opening C5 formed in the third insulating layer 20. The opening C1 formed in the second insulating layer 16 may be formed to overlap the opening C5 formed in the third insulating layer 20.

The edge of the pixel electrode 118 may contact an edge A of a first contact layer 114 formed on the first insulating layer 13. The first contact layer 114 may be formed of a transparent conductive oxide including at least one selected from the group of ITO, IZO, ZnO, $In_2O_3$, IGO, and AZO.

A second contact layer 115 may be arranged on the first contact layer 114 to contact the first contact layer 114. The second contact layer 115 may include a same material as the gate electrode 215.

The edge A of the first contact layer 114 may protrude beyond an edge of the second contact layer 115. Accordingly, the pixel electrode 118 may contact the edge A of the first contact layer 114. The first contact layer 114 may contact the second contact layer 115, and the second contact layer 115 may contact the drain electrode 217b of the TFT via a contact hole C2 formed in the second insulating layer 16.

The pixel electrode 118, used as a semi-transmittance metal layer, may be thin and thus may have a poor step coverage. Accordingly, it may be hard for the edge of the pixel electrode 118 to directly contact the drain electrode 217b formed on the second insulating layer 16 along an etching surface of the opening C1 formed in the second insulating layer 16. According to the present embodiment, in terms of a method of electrically connecting the pixel electrode 118 and a driving device, the edge of the pixel electrode 118 does not directly contact the drain electrode 217b formed on the second insulating layer 16 along the etching surface of the opening C1 formed in the second insulating layer 16, but contacts the first contact layer 114 directly formed on the first insulating layer 13. Accordingly, the contact between the pixel electrode 118 and the first contact layer 114 may be stable, and thus, signals from the driving device may be normally received.

The organic emission layer 121 may be arranged on the opening C5 formed in the third insulating layer 20. The organic emission layer 121 may include a small molecular weight organic material, a high molecular weight organic material, or a hybrid organic material including a small molecular weight organic material and a high molecular weight organic material.

In addition to the organic emission layer 121, at least one of a hole injection layer (HIL), a hole transport layer, an electron transport layer, and an electron injection layer may further be included between the pixel electrode 118 and the counter electrode 122. In other implementations, various other functional layers may further be included.

The OLED illustrated in FIG. 1 is an example of a sub-pixel included in a unit pixel. The sub-pixel may emit light of various colors. For example, the sub-pixel may emit a red, green, or blue light.

In other implementations, the sub-pixel may emit a white light. When the sub-pixel emits the white light, the organic light-emitting display apparatus 1 may further include a color converting layer that converts the white light into light colors, or a color filter. The sub-pixel that emits the white light may have diverse structures. For example, the sub-pixel may include a structure in which at least an emission material for emitting a red light, an emission material for emitting a green light, and an emission material for emitting a blue light are stacked.

In other implementations, the sub-pixel that emits the white light may include a structure in which at least an emission material for emitting a red light, an emission material for emitting a green light, and an emission material for emitting a blue light are combined.

Red, green, and blue colors are only an example. If the white light is to be emitted, other various combinations of colors may be used other than a combination of the red, green, and blue colors.

The counter electrode 122 may be arranged on the organic emission layer 121 as a common electrode that is commonly formed in the entire pixel. In the organic light-emitting display apparatus 1 according to the present embodiment, the pixel electrode 118 may be used as an anode, and, the counter electrode 122 may be used as a cathode. In other implementations, the opposite may be applied.

The counter electrode 122 may be a reflection electrode including a reflection material. The counter electrode 122 may be formed as a single layer or as multiple layers of at least one metal layer selected from the group of Al, Mg, Li, Ca, and lithium fluoride (LiF).

The capacitor may be included in the capacitor region CAP1. The capacitor may include a first electrode 312, a second electrode 314, and a third electrode 317.

The first electrode 312 of the capacitor may be arranged on a same layer as the active layer 212 of the TFT. The first electrode 312 of the capacitor may be formed of a semiconductor doped with ion impurities, like the source region 212a and the drain region 212b of the active layer 212.

The second electrode 314 of the capacitor may be arranged on a same layer as the gate electrode 215. However, materials of the second electrode 314 and the gate electrode 215 may be different. The second electrode 314 may include a transparent conductive oxide. The material of the second electrode 314 may be a same material as the first contact layer 114 described above. By forming a semiconductor on which ion impurities are doped on the first electrode 312 via the second electrode 314, the capacitor may be formed as a metal-insulator-metal (MIM) structure.

The first insulating layer 13 may be arranged between the first electrode 312 and the second electrode 314 of the capacitor. The first insulating layer 13 may serve as a first dielectric layer of the capacitor.

The third electrode 317 of the capacitor may be formed of a same material as the source electrode 217a and the drain electrode 217b.

The second insulating layer 16 may be arranged between the second electrode 314 and the third electrode 317. The second insulating layer 16 may serve as a second dielectric layer of the capacitor.

By parallel connecting the first electrode 312, the second electrode 314, and the third electrode 317 of the capacitor, without an increased area of the capacitor on the substrate 10, a capacitance of the organic light-emitting display apparatus 1 may be increased. Thus, an area of the capacitor may be reduced as the amount of increased capacitance. Accordingly, an aperture ratio of the organic light-emitting display apparatus 1 may be increased.

The organic light-emitting display apparatus 1 according to the present embodiment may further include an encapsulation member encapsulating predetermined areas including the pixel region PXL1, the capacitor region CAP1, and the TFT region TR1. The encapsulation member may be formed as an encapsulation layer on which a substrate including a glass material, a metal film, or an organic insulating layer, and an inorganic insulating layer are alternately disposed.

Hereinafter, stages of a method of manufacturing an organic light-emitting display apparatus 1, according to an embodiment, will be described by referring to FIGS. 2 through 8B.

Figure 2:
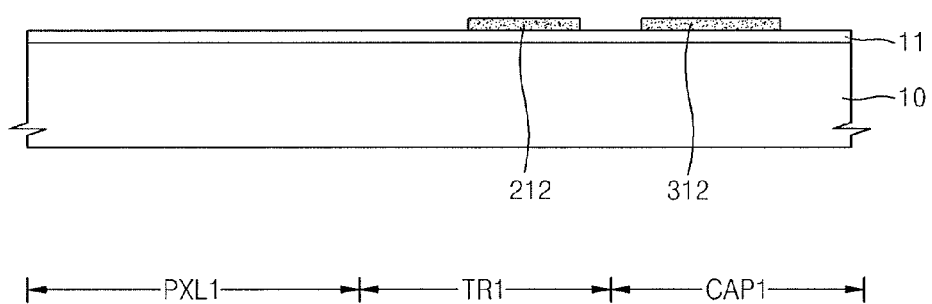
FIGS. 2 through 8B illustrate cross-sectional views illustrating stages of a method of manufacturing an organic light-emitting display apparatus, according to an embodiment.

FIG. 2 illustrates a cross-sectional view depicting a first mask process of the method of manufacturing the organic light-emitting display apparatus 1 according to an embodiment.

Referring to FIG. 2, an active layer 212 of a TFT and a first electrode 312 of a capacitor may be formed by forming a buffer layer 11 on a substrate 10, forming a semiconductor layer (not shown) on the buffer layer 11, and patterning the semiconductor layer.

The above-described active layer 212 and the first electrode 312 may be formed by spreading a photoresist on the semiconductor layer and patterning the semiconductor layer by a photolithography process using a photomask. The first mask process by photolithography may be preceded by a series of processes including developing, etching, and stripping, or ashing, after light exposure to a first photomask via a light exposure device.

The semiconductor layer may include amorphous silicon or polysilicon. Polysilicon may be formed by crystallizing amorphous silicon. A crystallization method of amorphous silicon may include various methods, such as rapid thermal annealing (RTA), solid phase crystallization (SPC), excimer laser annealing (ELA), metal-induced crystallization (MIC), metal-induced lateral crystallization (MILC), or sequential lateral solidification (SLS). In other implementations, the semiconductor layer may include an oxide semiconductor or an organic semiconductor.

Figure 3:
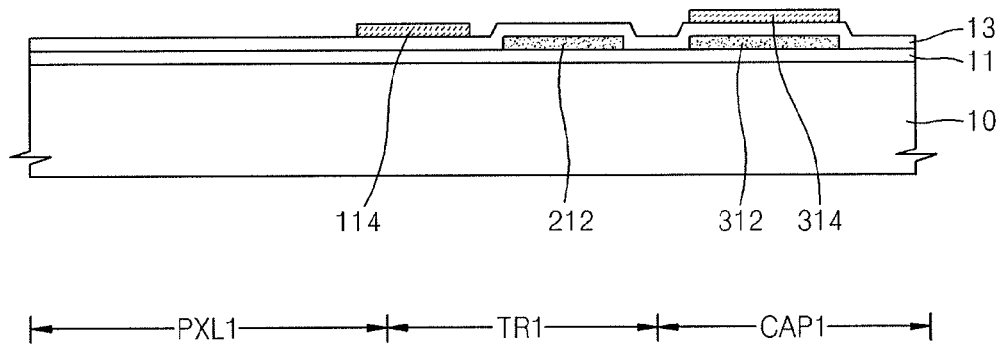

FIG. 3 illustrates a cross-sectional view depicting a second mask process of the method of manufacturing the organic light-emitting display apparatus 1, according to the present embodiment.

A first insulating layer 13 may be formed on the result of the first mask process of FIG. 2, and a transparent conductive oxide layer is formed on the first insulating layer 13 and patterned.

As a result of the patterning, a second electrode 314 of the capacitor and a first contact layer 114 may be formed on the first insulating layer 13.

Figure 4:
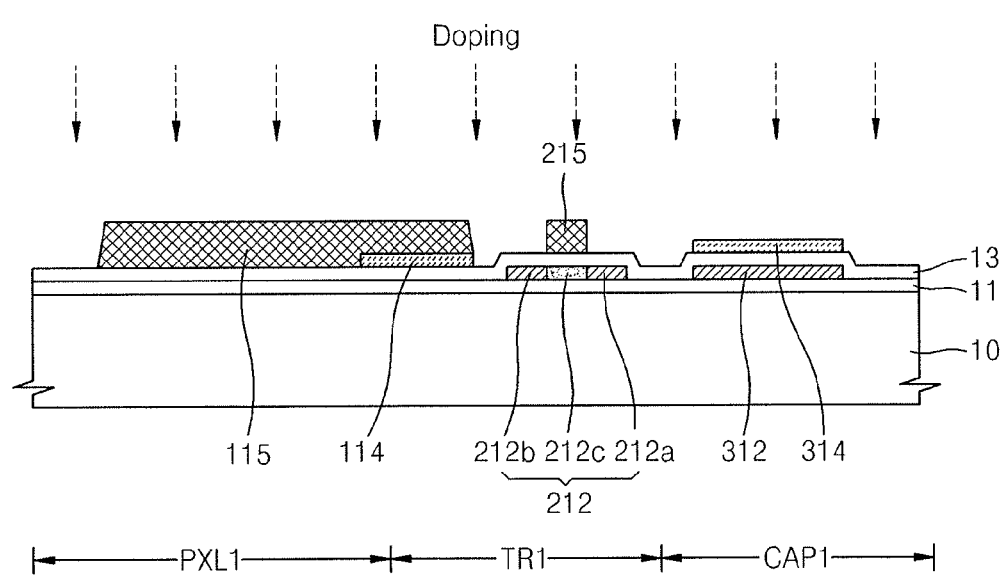

FIG. 4 illustrates a cross-sectional view depicting a third mask process of the method of manufacturing the organic light-emitting display apparatus 1, according to the present embodiment.

On the result of the second mask process of FIG. 3, a first metal layer is stacked and patterned. The first metal layer may be formed as a single layer or as multiple layers of at least one metal selected from the group of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu).

As a result of the patterning, a gate electrode 215 and a second contact layer 115 may be formed on the first insulating layer 13.

The result of the third mask process is doped with impurities. In terms of ion impurities, B-type or P-type ion impurities may be doped at a concentration equal to or greater than $1 \times 10^{15}$ atoms/cm$^2$, with the active layer 212 of the TFT and the first electrode 312 of the capacitor as the target.

The active layer 212 may be doped with ion impurities by using the gate electrode 215 as a self-aligned mask. The active layer 212 may include a source region 212a and a drain region 212b that are doped with ion impurities, and a channel region 212c arranged between the source region 212a and the drain region 212b.

The second electrode 314 arranged on the first electrode 312 may be formed thin with a thickness that is equal to or less than 1,000 Å. Accordingly, the first electrode 312 may also be doped with ion impurities. As a result, the first electrode 312 that is doped with ion impurities may form an MIM CAP structure along with the second electrode 314 including a transparent conductive oxide. When designing a circuit, a voltage design margin may be increased.

Also, by doping once, the first electrode 312 of the capacitor as well as the active layer 212 may be doped at the same time, thereby reducing manufacturing cost due to the reduction of the number of doping processes.

Figure 5:
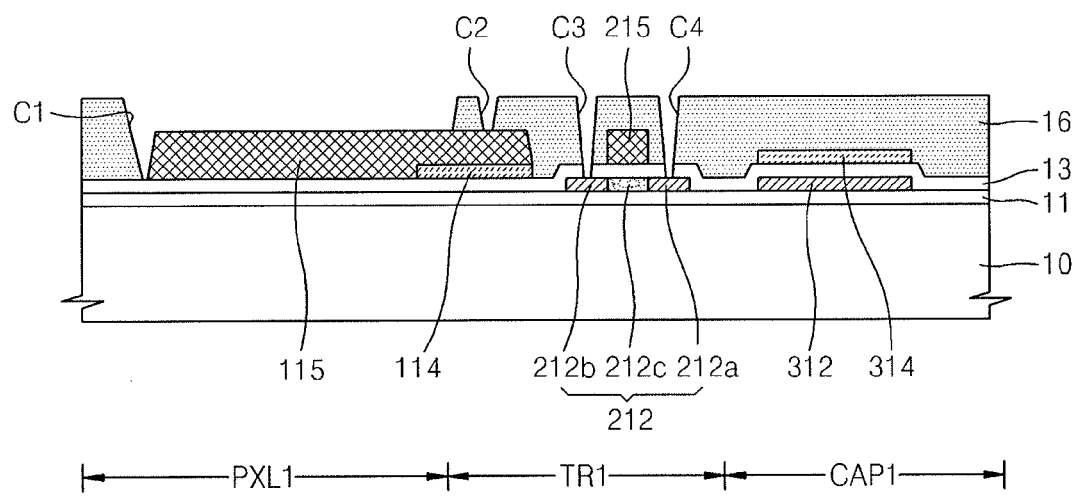

FIG. 5 illustrates a cross-sectional view depicting the result of a fourth mask process of the method of manufacturing the organic light-emitting display apparatus 1, according to the present embodiment.

Referring to FIG. 5, by forming a second insulating layer 16 on the result of the doping process of FIG. 4 and patterning the second insulating layer 16, an opening C1 that exposes the second contact layer 115, an opening C2 that exposes a region of the first contact layer 114, and openings C3 and C4 that expose the source region 212a and the drain region 212b of the active layer 212 may be formed.

Figure 6:
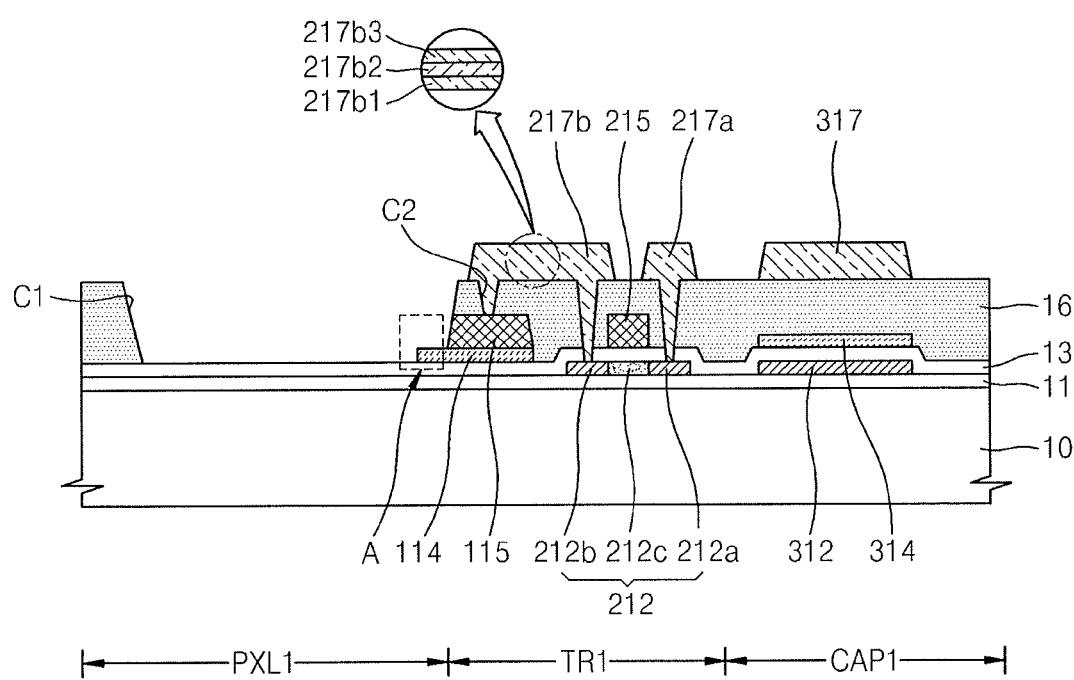

FIG. 6 illustrates a cross-sectional view depicting the result of a fifth mask process of the method of manufacturing the organic light-emitting display apparatus 1, according to the present embodiment.

Referring to FIG. 6, by forming a second metal layer (not shown) on the result of the fourth mask process of FIG. 5 and patterning the second metal layer, a source electrode 217a and a drain electrode 217b, and a third electrode 317 of the capacitor may be formed at the same time.

The second metal layer may be formed of at least two metal layers that have different electron mobilities. For example, the second metal layer may be formed of at least two metal layers selected from the group of Al, Pt, Pd, Ag, Mg, Au, Ni, Nd, Ir, Cr, Li, Ca, Mo, Ti, W, Cu, and an alloy thereof.

To exemplify the structure of the second metal layer, the structure of the drain electrode 217b is illustrated in detail. For example, the second metal layer according to the present embodiment may be formed to include a first layer 217b1 including Mo, a second layer 217b2 including Al, and a third layer 217b3 including Mo.

The second layer 217b2 including Al may be a metal layer having low resistance and excellent electrical characteristics. The first layer 217b1 that is arranged on a bottom portion of the second layer 217b2 and includes Mo may enhance adhesive strength between the second insulating layer 16 and the second layer 217b2. The third layer 217b3 that is arranged on an upper portion of the second layer 217b2 and includes Mo may serve as a barrier layer that prevents a heel lock, oxidation, and a diffusion of Al included in the second layer 217b2.

In the fifth mask process, by patterning the second metal layer, wirings including data wirings and electrode power supply wirings may be formed.

Figure 7A:
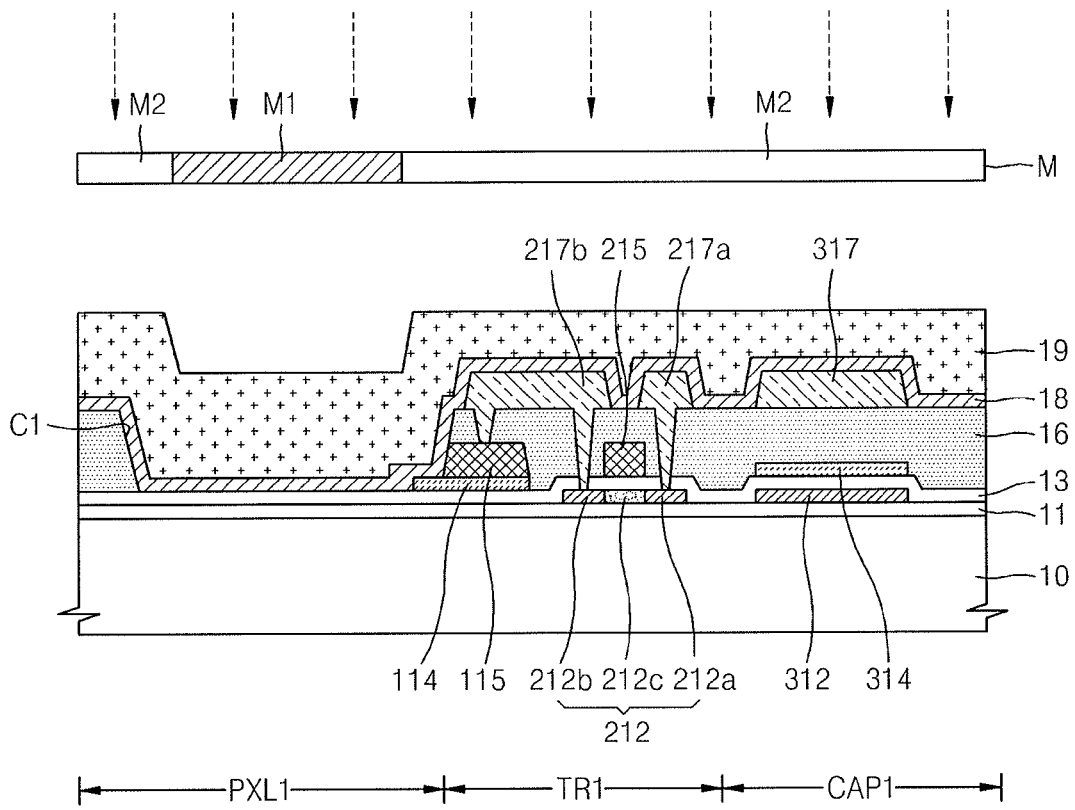
Figure 7B:
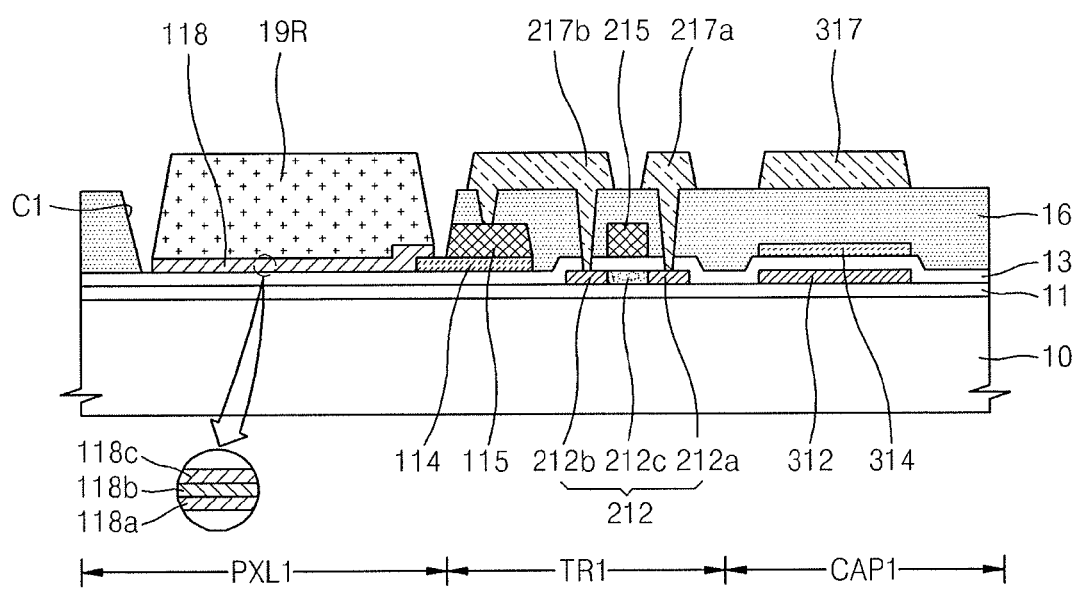

FIGS. 7A and 7B illustrate cross-sectional views depicting the result of a sixth mask process of the method of manufacturing the organic light-emitting display apparatus 1, according to the present embodiment.

Referring to FIG. 7A, a third metal layer 18 including a semi-transmittance metal may be formed on the result of the fifth mask process of FIG. 6, and, a photoresist 19 may be formed on the third metal layer 18. The same material as a third insulating layer 20 (described below) may be used for the photoresist 19.

A light exposure device may be used to expose the photoresist 19 to light via a photomask M including a light blocking unit M1 and a light transmittance unit M2. A series of processes, including developing, etching, and stripping, or ashing, may be performed. A portion of the photoresist 19R (refer to FIG. 7B) corresponding to the light blocking unit M1, that is, the portion of the photoresist 19R (refer to FIG. 7B) of an upper portion of a pixel electrode 118 (refer to FIG. 7B) may not be removed and may be maintained.

FIG. 7B illustrates the result of the sixth mask process. The pixel electrode 118 may be formed in a region corresponding to the light blocking unit M1, and, an edge of the pixel electrode 118 may contact an edge A of the first contact layer 114. On the upper portion of the pixel electrode 118, the photoresist 19R may not be removed but may be maintained.

As described above, the pixel electrode 118 may further include a semi-transmittance metal layer 118b, and transparent conductive oxide layers 118a and 118c including transparent conductive oxides, which may be arranged respectively on an upper portion and a bottom portion of the semi-transmittance metal layer 118b.

The pixel electrode 118 may be formed to include the semi-transmittance metal layer 118b. Also, the pixel electrode 118 may further include the transparent conductive oxide layers 118a and 118c including transparent conductive oxides, which are formed respectively on the upper portion and the bottom portion of the semi-transmittance metal layer 118b and protect the semi-transmittance metal layer 118b. The semi-transmittance metal layer 118b may form a microcavity structure along with the counter electrode 122, which may be a reflection electrode, thereby improving a luminescent efficiency of the organic light-emitting display apparatus 1.

The semi-transmittance metal layer 118b of which the pixel electrode 118 is formed may be formed of Ag or an Ag alloy.

In the case of a metal that has strong reducing power, such as Ag, which is included in the semi-transmittance metal layer 118b, Ag ions in an etchant, could again be extracted as Ag metal, when, during an etching process for patterning the pixel electrode 118, electrons are supplied. Ag extracted in such a way could be a particle fault factor leading to a generation of dark spots in a sequential process after forming the pixel electrode 118.

If, in the sixth mask process of etching the pixel electrode 118 including Ag, the source electrode 217a and the drain electrode 217b formed in the fifth mask process, or wirings including data wirings and electrode power supply wirings, which are formed of the same material as the source electrode 217a and the drain electrode 217b, were to be exposed to an etchant, Ag ions that have strong reducing power could be re-extracted as Ag by being supplied with electrons from the above metal materials. For example, if the metal materials include Mo or Al, Ag could be re-extracted because Mo provides electrons received from Al again to Ag ions. Ag particles that are re-extracted could be re-attached to the pixel electrode 118 in a sequential process and could be a particle pollution factor. The re-attached Ag particles could be a fault factor by generating dark spots.

However, according to the organic light-emitting display apparatus 1 and method of manufacturing the organic light-emitting display apparatus 1 according to the present embodiment, during the patterning of the pixel electrode 118 in the sixth mask process, the upper portion of the pixel electrode 118 is protected by being covered by the photoresist 19R. Thus, Ag particles that may be re-extracted while etching the pixel electrode 118 may be prevented or hindered from being re-attached to the pixel electrode 118, thereby preventing, or reducing the likelihood of, dark spots.

Figure 8A:
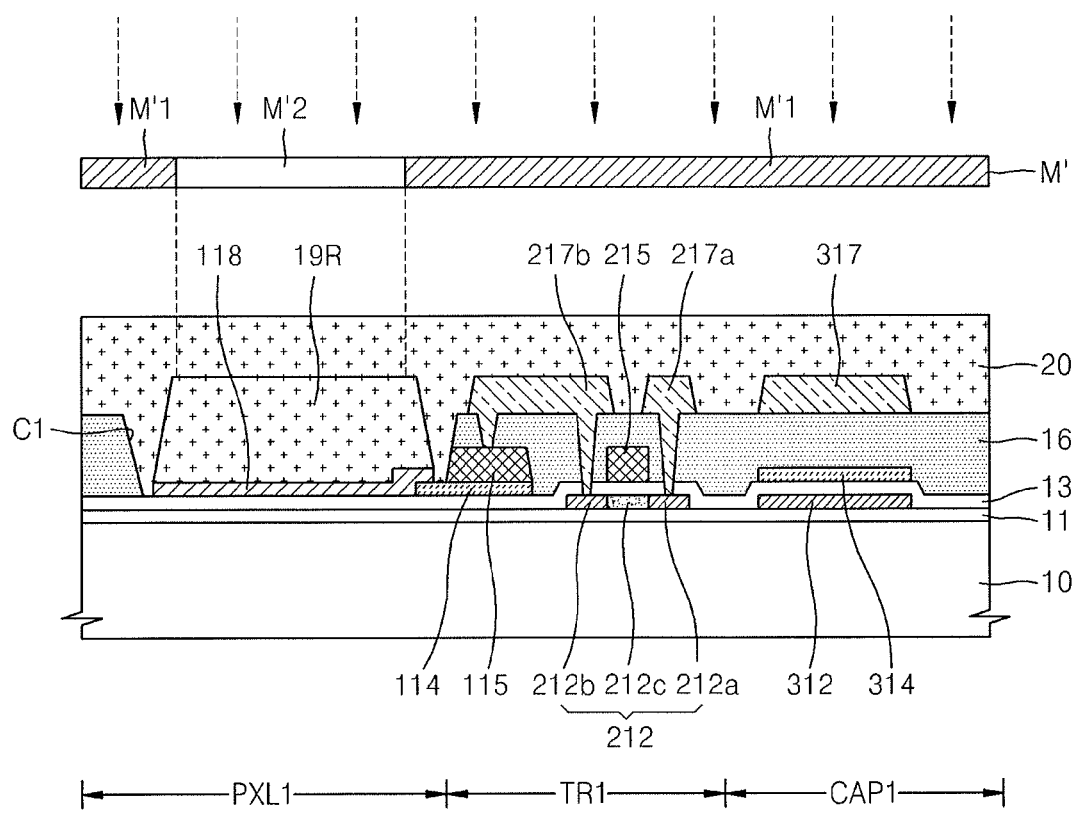
Figure 8B:
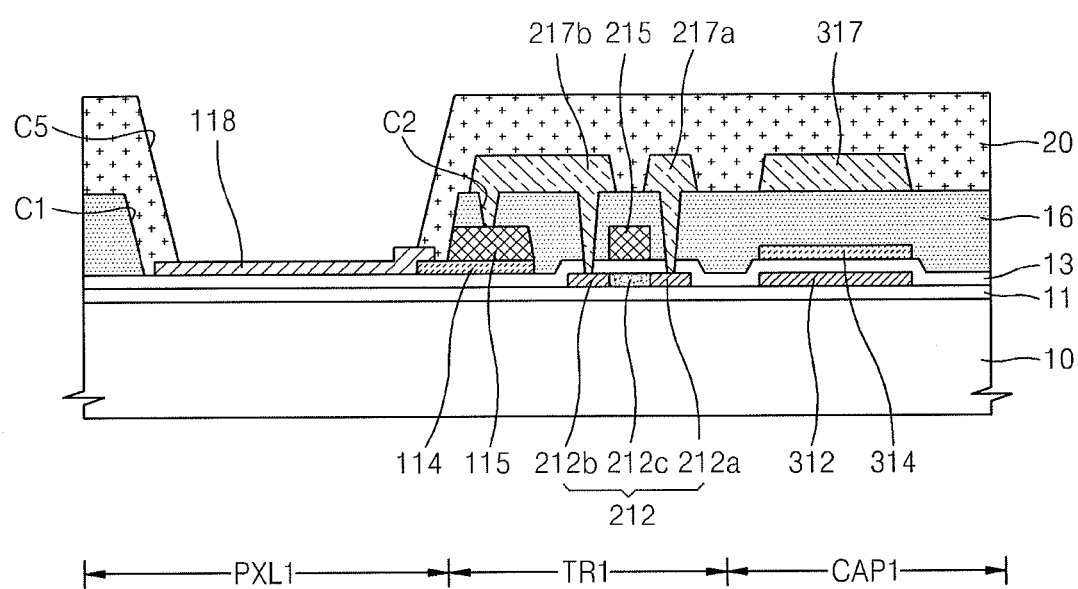

FIGS. 8A and 8B illustrate cross-sectional views depicting the result of a seventh mask process of the method of manufacturing the organic light-emitting display apparatus 1, according to the embodiment.

Referring to FIG. 8A, a third insulating layer 20 may be formed on the result of the sixth mask process of FIG. 7B.

The third insulating layer 20 may be formed of the same material as the photoresistor 19. The third insulating layer 20 may be formed as a single or as multiple organic insulating layers. The third insulating layer 20 may include a polymer, such as polymethylmethacrylate (PMMA) or polystyrene (PS), a polymer derivative having a phenol group, an acryl-based polymer, an imide-based polymer, an aryl ether-based polymer, an amide-based polymer, a fluorine-based polymer, a p-xylene-based polymer, a vinyl alcohol-based polymer or a mixture thereof. According to the present embodiment, the third insulating layer 20 may be formed of polyimide which allows little out-gassing.

Referring to FIG. 8B, the seventh mask process, in which an opening C5 that exposes the upper portion of the pixel electrode 118 is formed by patterning the third insulating layer 20, is performed. A light exposure device may be used to expose the third insulating layer 20 and a remaining portion of the photoresist 19 to light via a photomask M' including a light blocking unit M'1 and a light transmittance unit M'2. A series of processes, including developing, etching, and stripping, or ashing, may be performed.

The third insulating layer 20 may be patterned to cover an edge of the pixel electrode 118 and may serve as a pixel-defining layer. During the patterning of the third insulating layer 20, the photoresist 19R that was not removed in the sixth mask process and that was maintained on the pixel electrode 118 may be removed along with the third insulating layer 20. Thus, there may be no need to perform an additional mask process to make a protection layer for protecting the pixel electrode 118.

As described above, according to the one or more of the above embodiments, an organic light-emitting display apparatus having excellent luminescent efficiency and yield may be manufactured without an additional mask process.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic light-emitting display apparatus, comprising:
a thin film transistor (TFT) including an active layer, a gate electrode, a source electrode and a drain electrode, a first insulating layer between the active layer and the gate electrode, and a second insulating layer between the gate electrode and the source electrode and the drain electrode;
a capacitor including a first electrode on a same layer as the active layer and a second electrode on a same layer as the gate electrode;
a first contact layer of a same material as the second electrode;
a second contact layer on the first contact layer, the second contact layer being of a same material as the gate electrode;
a pixel electrode that contacts an edge of the first contact layer and is on an opening in the second insulating layer;
an organic emission layer on the pixel electrode; and
a counter electrode on the organic emission layer.

2. The apparatus as claimed in claim 1, wherein the pixel electrode includes a semi-transmittance metal layer.

3. The apparatus as claimed in claim 2, wherein the semi-transmittance metal layer includes silver (Ag) or an Ag alloy.

4. The apparatus as claimed in claim 1, wherein the counter electrode includes a reflective metal layer.

5. The apparatus as claimed in claim 1, wherein the first contact layer and the second contact layer are between the first insulating layer and the second insulating layer.

6. The apparatus as claimed in claim 1, wherein the first contact layer includes a transparent conductive oxide.

7. The apparatus as claimed in claim 1, wherein the edge of the first contact layer protrudes over an edge of the second contact layer.

8. The apparatus as claimed in claim 1, wherein one of the source electrode and the drain electrode contacts the second contact layer via a contact hole formed in the second insulating layer.

9. The apparatus of claim 1, wherein the source electrode and the drain electrode are in a form of a stack of metal layers that have different electron mobilities.

10. The apparatus as claimed in claim 9, wherein the source electrode and the drain electrode include a layer including molybdenum (Mo) and a layer including aluminum (Al).

11. The apparatus as claimed in claim 1, wherein the first electrode of the capacitor includes a semiconductor material doped with ion impurities.

12. The apparatus as claimed in claim 1, wherein the second electrode of the capacitor includes a transparent conductive oxide.

13. The apparatus as claimed in claim 1, wherein the capacitor further includes a third electrode on a same layer as the source electrode and the drain electrode.

14. The apparatus as claimed in claim 1, further comprising a third insulating layer that covers an edge of the pixel electrode and the source electrode and the drain electrode.

15. The apparatus as claimed in claim 14, wherein the third insulating layer is an organic insulating layer.

16. A method of manufacturing an organic light-emitting display apparatus, the method comprising:
forming an active layer of a thin film transistor (TFT) and a first electrode of a capacitor, by forming a semiconductor layer on a substrate and patterning the semiconductor layer;
forming a second electrode of the capacitor and a first contact layer, by forming a first insulating layer, forming a transparent conductive oxide on the first insulating layer, and patterning the transparent conductive oxide;
forming a gate electrode of the TFT on a same layer as the second electrode and forming a second contact layer on the first contact layer, by forming a first metal layer and patterning the first metal layer;

forming a second insulating layer and forming in the second insulating layer a contact hole to expose a portion of the active layer and an opening to expose the second contact layer;

forming a source electrode and a drain electrode of the TFT by forming a second metal layer and patterning the second metal layer, and patterning the second contact layer to expose an edge of the first contact layer;

forming a pixel electrode that contacts the edge of the first contact layer, by forming a semi-transmittance metal layer and patterning the semi-transmittance metal layer;

forming an opening to expose an upper surface of the pixel electrode, by forming a third insulating layer and patterning the third insulating layer;

forming an organic emission layer on the pixel electrode; and forming a counter electrode on the organic emission layer.

17. The method as claimed in claim 16, wherein:
patterning the semi-transmittance metal layer includes leaving a photoresist in a region in which the pixel electrode is formed, and
patterning the third insulating layer includes removing the photoresist.

18. The method as claimed in claim 17, wherein the photoresist and the third insulating layer are formed of a same material as an organic insulating layer.

19. The method as claimed in claim 16, further comprising doping the active layer and the first electrode of the capacitor with ion impurities once, after the forming of the gate electrode.

20. The method as claimed in claim 17, wherein the second metal layer is a stack of metal layers that have different electron mobilities.

* * * * *